United States Patent [19]

Lewis et al.

[11] Patent Number: 4,734,355

[45] Date of Patent: Mar. 29, 1988

[54] SENSITIVITY OF PROCESSLESS RECORDING MEDIA

[75] Inventors: David F. Lewis, Monroe, Conn.; Mark L. Moskowitz, Wayne, N.J.; Steward E. Purdy, Binghamton, N.Y.

[73] Assignee: GAF Corporation, Wayne, N.J.

[21] Appl. No.: 941,885

[22] Filed: Dec. 15, 1986

Related U.S. Application Data

[63] Continuation-in-part of Ser. No. 773,487, Sep. 9, 1985, abandoned.

[51] Int. Cl.$^4$ .......................... G03C 1/72; G03C 1/78
[52] U.S. Cl. .................................. 430/270; 430/271; 430/296; 430/346; 430/495
[58] Field of Search ............... 430/270, 271, 296, 346, 430/338, 332, 292, 495

[56] References Cited

U.S. PATENT DOCUMENTS 4,066,676 1/1978 Bloom et al. ........................ 430/495
4,581,315 4/1986 Garito ................................. 430/270

*Primary Examiner*—Won H. Louie
*Attorney, Agent, or Firm*—Marilyn J. Maue; Joshua J. Ward

[57] ABSTRACT

The process for improving radiant energy sensitivity of a film base coated with a dispersion of a normally crystalline polyacetylenic compound in a non-solvating liquid which is dried on the film surface; said polyacetylenic compound preferably having at least two conjugated acetylenic linkages and containing from 20 to 60 carbon atoms. The process comprises dispersing said normally crystalline polyacetylenic compound in the non-solvating liquid to a concentration of from about 2 to about 50% polyacetylene crystalline solids and ageing said dispersion by (a) storing at a temperature of between about 0° C. and about 12° C. for a period of from about 1 to about 30 days or (b) freezing said dispersion at a temperature between about −78° C. and about −1° C. for a period of from about 1 to about 75 hours or (c) a combination of the above ageing techniques any or all of which are completed before drying said dispersion on a substrate.

29 Claims, No Drawings

SENSITIVITY OF PROCESSLESS RECORDING MEDIA

This application is a continuation-in-part of co-pending patent application Ser. No. 773,487, filed Sept. 9, 1985, now abandoned, in the names of David F. Lewis, Mark L. Moskowitz and Steward E. Purdy.

DISCUSSION OF THE PRIOR ART

Photosensitive polyacetylenic systems and methods of exposure have been disclosed in several patents, namely U.S. Pat. Nos. 4,066,676; 4,581,315; 3,501,302; 3,501,297; 3,501,303; 3,501,308; 3,772,028; 3,844,791 and 3,954,816. Of these polyacetylenic compounds, including those of highest sensitivity, the recording of image information has presented several problems and shortcomings, such as an inadequate degree of resolution and clarity and color instability of the imaged pattern. Other deficiencies include relatively slow development of the image and, in certain cases, the need for imaging at extremely low temperatures in order to maintain image-receptivity of the polyacetylenic compound.

Accordingly, it is an object of the present invention to overcome the above difficulties and deficiencies by a convenient and commercially feasible process.

Another object of the present invention is to provide certain polyacetylene films which have extremely high sensitivity to radiant energy exposure.

Another object of the present invention is to provide energy sensitive polyacetylenic compounds which experience no reversability of color after imaging.

These and other objects of the invention will become apparent from the following description and disclosure.

THE INVENTION

According to this invention there is provided a process for improving the radiant energy sensitivity of a normally crystalline photosensitive polyacetylenic compound by introducing said crystals into a non-solvating liquid or binder to form a liquid dispersion containing from about 2 to about 50% solids and then ageing said dispersion at a temperature between about $-78°$ C. and about $12°$ C. for a period of from about 0.25 hour to about 30 days. The dispersion may be aged before or after coating on a film base or substrate; however, such ageing process should be completed before drying the dispersion on the substrate and imaging.

In the present process it is essential that ageing be effected with polyacetylene microcrystals dispersed in a liquid medium. The ageing can be performed on the dispersion per se or on the dispersion after it has been applied to a film base. The liquid medium of the dispersion is water and any of the subsequently named liquid binders or any other normally liquid compound or composition in which the crystals are insoluble as well as any combination of these. The dispersions presented for ageing essentially contain from about 1% to about 50%, preferably from about 4% to about 20% by weight of solid polyacetylene. Ageing is effected in the presence, or for light sensitive compounds, in the absence of visible light preferably at atmospheric pressure by storing the dispersion, freezing the dispersion or a combination of freezing and storing under certain critical time and temperature conditions. More specifically, storing the dispersion is effected by allowing the dispersion to stand at a temperature between about $0°$ C. and about $12°$ C. for a period of from about 1 to about 30 days, preferably between about $2°$ C. and about $8°$ C. for a period of from about 7 to about 15 days.

Alternatively the dispersion can be aged in a shorter period by freezing at a temperature between about $-78°$ C. and about $-1°$ C. for a period of from about 0.25 to about 75 hours, preferably between about $-25°$ C. and about $-10°$ C. for a period of from about 1 to about 30 hours. It is to be understood that the duration of freeze ageing is dependent on the temperature, so that a relatively small sample at $-78°$ C. can be aged effectively at the lower limit of ageing time, i.e. 0.25 hour. The freeze ageing operation involves a phase change in the dispersion so that the effects are more quickly realized.

A combination of the above methods may also be employed to shorten storage ageing time. For example, freezing can be effected for up to about 20 hours and the frozen dispersion gradually allowed to warm up to about $12°$ C. where it is held for a period of from about 0.5 to about 10 hours.

After the ageing process is completed, the dispersion is allowed to warm to ambient temperature and is dried, or applied and dried, on the surface of the base film, to form an imaging layer on said base film substrate.

Because the crystal size of commercially available, normally crystalline polyacetylenes is often relatively large and of varying dimension and since for the coatings of the present invention a microcrystalline size, between about 0.01 and about 5 micrometers, preferably between about 0.05 and about 0.2 micrometers, is most desirable, it is generally recommended that the commercial polyacetylene be first dissolved in a solvent from which it can be subsequently recrystallized as fine discrete crystals of a more uniform size. Suitable solvents which can be employed are those immiscible or slightly soluble in water such as for example n-butanol, glycol ethers, cyclohexanone and higher molecular weight liquid hydrocarbons. Those which have a relatively low boiling point are particularly useful since they can easily be removed by evaporation.

After the crystals are dissolved, the resulting solution is combined with an aqueous solution of a binder at an elevated temperature of from about $35°$ C. to about $100°$ C. with vigorous mixing. The solution can then be gelled by chill setting at $20°-35°$ C. within 3 minutes. The solvent is then removed, e.g. by evaporation or repeated water washing, whereupon the desired fine crystals are formed and are uniformly dispersed in the binder. Water is added where necessary to assure proper dilution of 2-50% solids in the dispersion. To promote better emulsification of the organic phase in the aqueous phase and thereby more uniform crystals, a minor amount of a conventional surfactant may be included in the binder solution.

For the purposes of the present invention, it is preferred to employ a multi-layered base film as the imaging medium. When such an imaging medium is employed in a charged particle beam system, it essentially contains a separate conductive layer underlying the polyacetylene imaging layer consisting of polyacetylene crystals in a binder, and may also contain separate support and adhesive layers. However, in certain applications, where the polyacetylene binder has sufficient integrity at exposure temperatures, the imaging film may consist solely of crystals suspended in the binder which forms a single layer base film as the imaging medium. Such imaging films can be employed when the imaging energy source is other than a charged particle beam; in which cases, the need for a conductive layer is eliminated.

A typical film for the purpose of the present invention comprises microcrystalline polyacetylene in a non-solvating binder forming a layer of from about 0.25 to about 500 micrometers, preferably from about 2 to about 10 micrometers, thickness which overlays a substrate of from about 2 to about 10 mils thickness.

Imaging media suitable for the purposes of the present invention are any of those commercially available and generally include an electrically conductive layer of between about 1Å to about 0.25 micrometers thickness, preferably 100Å to about 0.05 micrometers thickness. Although transparent conductive layers of up to about 0.05 micrometers are most preferred, opaque conductive layers of up to 5 micrometers can also be employed when need arises. The conductive layer limits the capacitance of the charge accepting layer, namely the image-receptive polyacetylenic crystals dispersed in binder, and typically has a resistivity of $10^6$ ohms/square or less. The conductive material is an electrically conductive metal, metal oxide, metal alloy, metal halide or carbon black which metal, metal compound and carbon black components may or may not be suspended in a dispersion medium such as gelatin, dextran, a cellulose ether or ester or any other conventional suspension medium. Suitable metals include gold, silver, platinum, copper, iron, tin, aluminum, indium, nickel, palladium, rhodium and mixtures of these as may occur in alloys and metal oxides or halides. A specific metal oxide which may be suitably employed includes indium-tin oxide. Silver bromide and copper iodide are representative of the metal halides which may be used as the conductive layer. Of these conductive materials, indium-tin oxide is most preferred.

The conductive layer is usually supported by a substrate of between about 0.25 and about 100 mils, preferably 0.5 to 10 mils, thickness. Suitable materials employed as substrates include polyester, polyethylene terephthalate, glass, clay-sized paper, fiberboard, metal sheeting, glazed ceramic, cellulose acetate, polystyrene, polycarbonates or any other conventional support.

The substrate or support can be flexible or rigid, opaque or transparent depending on the final use of the film. Particularly preferred are the commercial polyester substrates such as MYLAR (polyethylene terephthalate), supplied by E. I. du Pont Corporation and HOSTAPAN supplied by American Hoechst.

The image-receptive layer generally overlays a supported conductive layer, and in certain cases is more firmly affixed thereto by means of a thin adhesive layer having a thickness of between 1 and 1.5 micrometer. When used, suitable adhesives include acrylate based polymers and copolymers, particularly those containing carboxylate moieties such as acrylic acid or methacrylic acid residues and mixtures of these polymers or copolymers with gelatin.

In certain cases, when a conductive metal sheet is employed as the substrate, a separate conductive layer may be eliminated and the image-receptive layer disposed directly on the metal sheet conductive support.

The image receptive layer, which is the surface layer of the imaging film, comprises the polyacetylenic microcrystals dispersed in a binder material. The polyacetylenic compounds of the present invention are normally crystalline at ambient temperature and are preferably conjugated diynes, most preferably hydrocarbon or acid diynes containing from 20 to 30 carbon atoms. A general formula for these preferred acetylenic compounds is, represented by the structure $A-(CH_2)_n-C\equiv C-C\equiv C-(CH_2)_m-B$ wherein m and n are both independently an integer of from 6 to 14 and A and B are independently methyl or carboxyl groups. Specific examples of such polyacetylenes include pentacosa-10,12-diynoic acid; 13,15-octacosadiyne and docosa-10,12-diyne-1, 22-dioic acid. Of these, the aged pentacosa-10,12-diynoic acid is most preferred since it provides unusually high sensitivity to electron beam exposure. It is to be understood however, that dispersions of other normally crystalline, color developing polyacetylenes having a conjugated structure can be employed alone or in admixture with the preferred diynes as the image receptive layer of the present invention. Such compounds include the diynes of the above structure wherein the A and/or B moieties, in addition to lower alkyl or carboxyl, also can be hydroxy, amido, lower alkyl substituted amido, an aliphatic or aromatic carboxylate ester group having up to 10 carbon atoms, a mono- or di- valent carboxylate metal salt group, halo, carbamyl, lower alkyl substituted carbamyl or tosyl, as well as the corresponding triyne and tetrayne products of the above polyacetylenes having from 20 to 60 carbon atoms and a conjugated structure. Examples of these compounds include 10,12-docosadiynediol, the ditoluene-p-sulfonate of 9,11-eicosadiynoic acid, the monoethyl ester of 10,12-docosadiynedioic acid, the sodium or potassium salt of 10,12-pentacosadiynoic acid, 10,12-docosadiyne chloride, 10,12-pentacosadiyne (m-tolyl- urethane), 10,12-pentacosadiyne {[(butoxylcarbonyl)- methyl]urethane}, N-(dimethyl)-10,12-pentacosadiynamide, N,N'-bis($\alpha$-methylbenzyl) 10,12-pentacosadiyndiamide, etc. The polyacetylenic compounds of this invention are employed in microcrystalline form and these crystals are dispersed, in a non-solvating liquid binder preferably an aqueous solution of plastic, resin, colloid or gel and coated on a suitable conductive substrates to a layer thickness of from about 0.25 to about 500 micrometers. On drying, the crystals become fixedly positioned in the binder.

Exemplary binder materials include natural and synthetic plastics, resins, waxes, colloids, gels and the like including gelatins, desirably photographic-grade gelatin, various polysaccharides including dextran, dextrin, hydrophilic cellulose ethers and esters, acetylated starches, natural and synthetic waxes including paraffin, beeswax, polyvinyl-lactams, polymers of acrylic and methacrylic esters and amides, hydrolyzed interpolymers of vinyl acetate and unsaturated addition polymerizable compounds such as maleic anhydride, acrylic and methylacrylic esters and styrene, vinyl acetate polymers and copolymers and their derivatives including completely and partially hydrolyzed products thereof, polyvinyl acetate, polyvinyl alcohol, polyethylene oxide polymers, polyvinylpyrrolidone, polyvinyl acetals including polyvinyl acetaldehyde acetal, polyvinyl butyraldehyde acetal, polyvinyl sodium-o-sulfobenzaldehyde acetal, polyvinyl formaldehyde acetal, and numerous other known photographic binder materials including a substantial number of aforelisted useful plastic and resinous substrate materials which are capable of being placed in the form of a dope, solution, dispersion, gel, or the like for incorporation therein of the photosensitive polyacetylenic composition and then capable of processing to a solid form containing dispersed crystals of the photosensitive crystalline polyacetylenic composition of matter. As is well known in the art in the preparation of smooth uniform continuous coatings of binder materials, there may be employed therewith small amounts of conventional coating aids as viscosity controlling agents, surface active agents, leveling agents, dispersing agents, and the like. The particular binder material employed is selected with due regard to the specific radiant energy and technique to be employed in the particular image-recording application and invariably is a binder material permitting substantial transmission or penetration of that specific radiant energy to be employed.

The radiant energy contemplated as the energy source in the present invention includes energy generated from an electron beam such as developed by cathode ray guns, gamma rays and X-rays used in radiography, beta rays, electron corona discharge, ultra-violet and light, actinic radiation from visible and infra-red regions of the electromagnetic spectrum and other forms of corpuscular and/or wave-like energy generally deemed to be radiant energy. For radiographic and short wave UV exposure, the conductive layer in the above dielectric film may be eliminated and the image-receptive crystals in the binder may be disposed directly on the substrate material; although absence of the conductive layer may permit the film to become so charged that a beam of electrons or ions employed for imaging may be somewhat distorted.

The preferred source of energy employed in the present invention is the electron beam. Generally the electrons, under high vacuum, between about $10^{-3}$ and about $10^{-9}$ torr, preferably between about $10^{-5}$ and about $10^{-8}$ torr, bombard the surface of the film, thus transmitting an image thereon for development into an optical display. The techniques of electron beam recording are well known, thus further amplification is not required. However, for illustrative purposes, a typical electron beam recording operation suitable for the present invention may utilize an electron beam characterized by having a beam diameter of from about 1 to 25 micrometers, an energy of from about 10 to 30 KeV, a current flow of from about $10^{-9}$ to $10^{-6}$ amps and adapted to scan a target area at a rate such that the dwell time is from about $10^{-3}$ to $10^{-8}$ seconds. Vacuum pressures in the film chamber commonly range from $10^{-3}$ to $10^{-5}$ torr.

In one embodiment of the invention, an aged dispersion of the polyacetylene crystals in binder is applied to the surface of a base film and dried thereon at a temperature of from about ambient temperature up to about 100° C. but below the distortion temperature of the substrate or binder, and below the decomposition temperature or melting point of the polyacetylene compound. The drying operation is conducted over a period of from about 20 seconds to about 10 hours and is preferably effected at 15° to 60° C. for a period from about 1 minute to about 5 hours.

Upon exposure of the coated base film to the image transmitted from a radiant energy source, the aged and dried polyacetylene crystals, fixedly positioned in the binder, undergo a color change in the exposed areas to provide a replica of the transmitted image or pattern of the exposure in high resolution and contrast to the unexposed background. The color change occurs almost instantaneously or within a period of up to 2 days and the image is transmitted directly to the film without need for extraeneous development. By employing the ageing process of the present invention, an image receiving layer of up to $6 \times 10^{-8}$ C/cm$^2$ and higher sensitivity, defined as the dosage of 20 KeV electrons required to produce a visual density of 2, can be obtained. Also, a maximum density greater than 4 can be achieved.

Having thus described the invention, reference is now had to the following examples which illustrate preferred embodiments of the invention but which are not to be construed as limiting to its scope which is more broadly defined above and in the appended claims.

EXAMPLE 1

PREPARATION OF DISPERSION

In a glass beaker, 15 g of pentacosa-10,12-diynoic acid non-uniform crystals were dissolved at 38° C. in 45 g of ethyl acetate to form a solution, Solution A. A second solution, Solution B, was prepared by dissolving 15 g of photographic gelatin in 250 g of water and 30 ml of an aqueous solution containing 3% by weight of surfactant GAFAC-RS-710[1]. Solution B was heated to 40° C. and introduced into a 1 quart size Waring blender. While blending at high speed, Solution A was added to Solution B over about a 30 second period. Blending was continued for an additional 2.5 minutes before pouring onto a stainless steel tray where it was allowed to chill set. The resulting gelled dispersion was cut into approximately 1 cm cubes and allowed to sit in an airstream at about 32° C. to remove ethyl acetate by evaporation. After the ethyl acetate had been removed, the gelled dispersion was reconstituted by melting at 40° C. and adding sufficient water to replace the weight loss that occurred during drying. The average crystal size was between about 0.05 and about 0.22 micrometers.

[1] an acid phosphate ester of nonyl phenol supplied by GAF Corporation

EXAMPLE 2

COATING THE FILM BASE

The reconstituted dispersion prepared in Example 1 was melted and directly coated at about 10 micrometers thickness on a 4 mil film base, SIERRACIN INTREX-K [2]. which is a polyester base carrying an indium-tin oxide conductive coating which had been overcoated with a 1 micrometer thick layer of an adhesion promoting material composed of about 50 wt. % gelatin and 50 wt % of a latex polymer. The coated film was then allowed to dry in air at ambient temperature. After drying was completed, the coated film was exposed to 20 KeV electron imaging until a blue image of the transmitted information formed. The image on the dried dispersion layer had a maximum density of 3.35 and a sensitivity of $2.7 \times 10^{-7}$ coulombs/cm$^2$ [3].

[2] supplied by Sylmar/Sierracin Company
[3] defined as the exposure dosage of 20 KeV electrons required to produce a density of 2.0 in all examples

EXAMPLE 3

Five samples of coated film base, prepared as in Examples 1 and 2, were prepared and labeled, e.g. 3A-3E. Each of these samples was exposed to 20 KeV electron beam imaging and the maximum density and sensitivity of the resulting imaged film was determined as shown in the following Table I.

TABLE I

| Sample | Maximum Density | Sensitivity $\times 10^{-7}$ C/cm$^2$ |
| --- | --- | --- |
| Example 1 | 3.35 | 2.7 |
| 3A | 2.80 | 7.5 |
| 3B | 2.96 | 5.7 |

TABLE I-continued

| Sample | Maximum Density | Sensitivity $\times 10^{-7}$ C/cm$^2$ |
| --- | --- | --- |
| 3C | 3.40 | 2.8 |
| 3D | 2.93 | 5.7 |
| 3E | 2.74 | 8.0 |

Although all of the above samples were made in the same way, with identical materials, the data shows a high variation of results which establish the unpredictability of density and sensitivity when employing the procedure of Examples 1 and 2.

EXAMPLE 4

Three dispersion samples, (4A, 4B and 4C) were prepared as in Example 1. Each of the samples was divided into 2 portions. The first portion of each sample was coated directly on the film base as in Example 2, while the second portions were each refrigerated at about 4° C. for a period of 18 days and then coated on the film base as in Example 2. All samples were exposed to 20 KeV electron beam imaging and the sensitivities ($\times 10^{-7}$ C/cm$^2$) of the imaged films were then determined, the results of which are shown in Table II.

TABLE II

| | SENSITIVITY, $\times 10^{-7}$ C/cm$^2$ | |
| --- | --- | --- |
| Sample | Non-Aged Coating | Aged Coating |
| 4A | 1.6 | 1.4 |
| 4B | 13.0 | 1.2 |
| 4C | 13.0 | 1.3 |

Again, the above data show the inconsistent sensitivity of films directly coated with the freshly prepared imaging dispersion. The data also demonstrate that ageing results in increased sensitivity at highly reproducable values.

EXAMPLE 5

Samples 5A, 5B and 5C were prepared according to the procedure of Example 1. Seven equal portions of each sample were taken. The first was directly coated on the film base as described in Example 2. The remaining portions were aged at about 4° C. for various periods up to 25 days, as shown in Table III before coating the film base as in Example 2. Each of the sample portions was exposed to 20 KeV electron beam imaging after which sensitivity was determined as shown in the following Table.

TABLE III

| Ageing Period | SENSITIVITY, C/cm$^2$ | | |
| --- | --- | --- | --- |
| (days) | 5A | 5B | 5C |
| none | $1.2 \times 10^{-6}$ | $5.4 \times 10^{-7}$ | $9.1 \times 10^{-7}$ |
| 1 | $1.0 \times 10^{-6}$ | $4.0 \times 10^{-7}$ | $1.0 \times 10^{-6}$ |
| 4 | — | — | $1.0 \times 10^{-6}$ |
| 8 | $1.9 \times 10^{-7}$ | $3.8 \times 10^{-7}$ | $8.0 \times 10^{-7}$ |
| 12 | $1.9 \times 10^{-7}$ | $2.5 \times 10^{-7}$ | $4.5 \times 10^{-7}$ |
| 15 | $1.8 \times 10^{-7}$ | $1.0 \times 10^{-7}$ | $3.0 \times 10^{-7}$ |
| 25 | $1.8 \times 10^{-7}$ | $2.0 \times 10^{-7}$ | $2.8 \times 10^{-7}$ |

This data illustrates the progressive increase in sensitivity on ageing and also show that the benefit obtained from ageing reaches a threshold (at about 15 days) beyond which there is no significant increase in sensitivity. It is also noted that there is no degradation of the dispersion due to storage for longer periods.

EXAMPLE 6

Two samples were prepared according to Example 1 and each was directly coated on a film base according to Example 2. Each of these samples were imaged by a UV light source at short wave UV radiation of 254 nanometers using the increasing exposure times noted in Table IV. Blue images were formed and the densities of these images were recorded. The samples were then aged for 2 weeks at about 4° C. and the same exposures from the same UV light source were repeated. Again the densities of the images were recorded. The results of this experiment are shown in Table IV.

TABLE IV

| | VISUAL DENSITY | |
| --- | --- | --- |
| Exposure time (minutes) | Non-Aged Coating | 2-Week Aged Coating |
| 1 | 0.24 | 0.28 |
| 2 | 0.71 | 0.70 |
| 3 | 0.72 | 0.75 |
| 4 | 0.83 | 0.85 |
| 5 | 0.89 | 0.92 |

The above data show that the process provides no benefit when ageing the polyacetylene in binder after drying. Accordingly, ageing the dispersion containing 2 to 50% polyacetylene crystals, in a wet state, is a critical consideration in the present process.

EXAMPLE 7

Example 6 was repeated except that one sample was aged at about 4° C. for 2 weeks before drying on the film base while the remaining sample was directly coated on the film without ageing. The results of these samples, when exposed to the same UV light source, are compared with the non-aged samples of Example 6 as shown in the following Table V.

TABLE V

| | VISUAL DENSITY | |
| --- | --- | --- |
| Exposure Time (minutes) | Non-aged Coating | Aged Coating in wet state |
| 1 | 0.24 | 0.81 |
| 2 | 0.71 | 1.36 |
| 3 | 0.72 | 1.79 |
| 4 | 0.83 | 2.02 |
| 5 | 0.89 | 2.15 |

The above results show a remarkable improvement in density when ageing the dispersion in the wet state.

EXAMPLE 8

Three samples (8A, 8B and 8C) were prepared according to Example 1. The dispersion of Sample 8A was directly coated on the base film without ageing and dried thereon as described in Example 2. The dispersion of Sample 8B was frozen at about −15° C. for a period of 2 hours; whereas the dispersion of Sample 8C was frozen at about −15° C. for a period of 3 days.

After freezing, the dispersions of 8B and 8C were allowed to warm to room temperature after which they were coated on separate base films and dried thereon as described in Example 2.

All three samples were exposed by imaging with UV light (short wave UV radiation of 254 nanometers). The following image densities were obtained.

TABLE VI

| Exposure Time (minutes) | VISUAL DENSITY | | |
|---|---|---|---|
| | 8A | 8B | 8C |
| 1 | 0.12 | 0.82 | 0.86 |
| 2 | 0.22 | 1.53 | 1.51 |
| 3 | 0.37 | 1.92 | 1.89 |
| 4 | 0.46 | 2.15 | 2.09 |
| 5 | 0.40 | 2.22 | 2.18 |

The above results establish the remarkable improvement of image density achieved by freezing the dispersion prior to drying on the base film. The data also shows that substantially the same degree of density improvement is realized after 2 hours up to 3 days or longer but that the dispersion is in no way degraded by the longer freezing period. Comparing the results for 8B with those for the aged sample set forth in Example 7, it becomes evident that the effective ageing of the dispersion is significantly accelerated when freezing is employed as the ageing process.

EXAMPLE 9

The preceding Example 8A was repeated except that Sample 8A was frozen at $-15°$ C. for 12 hours after being dried on the base film. This sample was designated as Sample 9 and comparison of visual density found for Sample 9 and sample 8A of the preceding example are presented in Table VII.

TABLE VII

| Exposure Time (minutes) | VISUAL DENSITY | |
|---|---|---|
| | 8A | Sample 9 |
| 1 | 0.12 | 0.17 |
| 2 | 0.22 | 0.32 |
| 3 | 0.37 | 0.47 |
| 4 | 0.46 | 0.58 |
| 5 | 0.40 | 0.62 |

As in the case of electron beam imaging, the data in this example shows no significant improvement of the non-aged sample when the freezing is effected on a dryed coating.

EXAMPLE 10

The preparation of Example 1 is repeated except that drying to remove ethyl acetate and reconstitution with water were omitted.

The dispersion was coated to 10 micrometers thickness on base film SIERRACIN INTREX-K as in Example 2 and was then chill set and frozen overnight at $-15°$ C. The coated film was then thawed and dried at about 50° C.

This sample was exposed to UV light (short wave UV radiation of 254 nanometers) and visual density observed and recorded as in the following Table VIII. The density of this product is compared so that of Example 8A as shown.

TABLE VIII

| Exposure Time (minutes) | VISUAL DENSITY | |
|---|---|---|
| | Sample 8A | Sample of Ex. 9 |
| 1 | 0.12 | 0.19 |
| 2 | 0.22 | 0.40 |
| 3 | 0.37 | 0.57 |
| 4 | 0.46 | 0.70 |
| 5 | 0.40 | 0.78 |

The data shows that the presence of the solvating liquid in the dispersion during ageing prevents development of full sensitivity. Thus, it is important to remove the solvent before ageing and permit crystallization of the polyacetylene in uniform microcrystals.

EXAMPLE 11

Two dispersions are prepared using the method of Example 1 except that 13,15-octacosadiyne and docosa-10,12-diyne-1,22-dioic acid are substituted for pentacosa-10,12-diynoic acid.

Each of the samples of this example is divided into two equal portions; one portion being coated immediately on film according to the method of Example 2 and the remaining portion of each sample being aged by freezing at $-15°$ C. overnight. The frozen portions are warmed to ambient temperature, melted and then coated on film as in Example 2. Each of the above portions are then exposed to a 20 KeV electron beam source to render an image on the surface. A substantial increase in sensitivity of the coatings prepared from the aged frozen dispersions is observed in comparison to the sensitivity resulting from the non-aged coatings of the corresponding diacetylene compounds.

What is claimed is:

1. A process for improving radiant energy sensitivity of an image-receptive, normally crystalline polyacetylene compound which comprises: (a) dispersing the polyacetylene microcrystals in a non-solvating liquid to form a liquid dispersion containing from about 1 to about 50% polyacetylene solids and (b) ageing said dispersion at a temperature between about $-78°$ C. and about 12° C. for a period of from about 0.25 hour to about 30 days and completing said ageing before drying said dispersion prior to imaging with said radiant energy.

2. The process of claim 1 wherein the aged dispersion is coated on the surface of a substrate, the coating is dried and subjected to radiant energy exposure for imaging.

3. The process of claim 2 wherein the substrate is an electrically conductive polyester film.

4. The process of claim 1 wherein the non-solvating liquid is water and a non-solvating binder in which the polyacetylene microcrystals are dispersable.

5. The process of claim 4 wherein the liquid medium of the dispersion is a mixture of water and binder and wherein the binder is gelatin.

6. The process of claim 1 wherein the polyacetylene is a conjugated diyne compound having from 20 to 30 carbon atoms.

7. The process of claim 6 wherein said diyne compound contains from 0 to 2 carboxyl groups.

8. The process of claim 6 wherein the diyne has the formula:

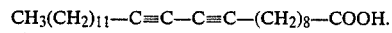
$CH_3(CH_2)_{11}-C\equiv C-C\equiv C-(CH_2)_8-COOH$.

9. The process of claim 6 wherein said diyne has the formula:

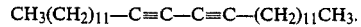
$CH_3(CH_2)_{11}-C\equiv C-C\equiv C-(CH_2)_{11}CH_3$.

10. The process of claim 6 wherein said diyne has the formula:

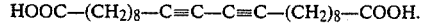
$HOOC-(CH_2)_8-C\equiv C-C\equiv C-(CH_2)_8-COOH$.

11. The process of claim 4 wherein the ageing comprises storing said crystals dispersed in said liquid medium at a temperature between about 0° C. and about 12° C. for a period of from about 1 to about 30 days before drying.

12. The process of claim 4 wherein said ageing comprises freezing said crystals dispersed in the liquid medium at a temperature between about −78° C. and about −1° C. for a period of from about 0.25 to about 75 hours before drying.

13. The process of claim 4 wherein the microcrystals dispersed in the liquid medium are frozen at a temperature between about −78° C. and about −1° C. for a period up to about 20 hours and then stored at a temperature between about 0° C. and about 12° C. for a period of from about 0.5 to about 10 hours before drying.

14. The process wherein the polyacetylene microcrystals are dispersed in a liquid binder and the dispersion forms the surface layer of an imaging film and said film is subjected to the ageing process of claim 11.

15. The process wherein the polyacetylene microcrystals are dispersed in a liquid binder and the dispersion forms the surface layer of an imaging film and said film is subjected to the ageing process of claim 12.

16. The process wherein the polyacetylene microcrystals are dispersed in a liquid binder and the dispersion forms the surface layer of an imaging film and said film is subjected to the ageing process of claim 13.

17. The process of claim 6 wherein a conjugated diyne compound of 22 to 28 carbon atoms and having a terminal carboxyl group is dispersed in a non-solvating liquid binder to provide a liquid medium containing from about 4% to about 20% polyacetylene microcrystalline solids and the dispersion is aged by storing at a temperature between about 2° C. and about 8° C. for a period of from about 7 to about 15 days.

18. The process of claim 6 wherein a conjugated diyne compound of 22 to 28 carbon atoms and having a terminal carboxyl group is dispersed in a non-solvating liquid binder to provide a liquid medium containing from about 4% to about 20% polyacetylene crystalline solids and the dispersion is aged by freezing at a temperature between about −25° C. and about −10° C. for a period of from about 1 to about 30 hours.

19. The process of claim 18 wherein the dispersion, after freezing, is allowed to warm to ambient temperature and is then melted, coated and dried on a film base prior to imaging.

20. The process of claim 17 wherein the dispersion, after storing, is directly coated and dried on a film base prior to imaging.

21. The process of claim 17 wherein said diyne is selected from the group consisting of pentacosa-10,12-diynoic acid, docosa-10,12-diyne-1,22-dioic acid and 12,15-octacosadiyne.

22. The process of claim 18 wherein said diyne is selected from the group consisting of pentacosa-10,12-diynoic acid, docosa-10,12-diyne-1,22-dioic acid and 12,15-octacosadiyne.

23. The product of the process of claim 1.

24. The composition comprising between about 4% and about 20% microcrystalline pentacosa-10,12-diynoic acid dispersed in aqueous gelatin and aged at a temperature between about −25° C. and about 12° C. for a period of from about 5 hours to about 15 days.

25. A recording film suitable for imaging by exposure to a source of radiant energy which comprises a film base on which is coated and dried the aged dispersion of claim 24.

26. The composition comprising between about 2 and about 50% of a normally crystalline conjugated polyacetylene compound dispersed in microcrystalline form in a non-solvating liquid and aged at a temperature of between about −78° C. and about 12° C. for a period of from about 0.25 hour to about 30 days.

27. A recording film suitable for imaging by exposure to a source of radiant energy which comprises a film base on which is coated and dried the aged dispersion of claim 26.

28. The process of claim 1 wherein the polyacetylene microcrystals suitable for said dispersion are produced by dissolving polyacetylene crystals of a larger non-uniform size in a solvent, subjecting the resulting solution to chill set removing said solvent, recrystalizing polyacetylene crystals of more uniform microcrystaline size of between about 0.01 and about 5 micrometers.

29. The process of claim 1 wherein said ageing is effected for a period of from about 1 hour to about 30 days.

* * * * *